US008058177B2

(12) United States Patent
Weiss et al.

(10) Patent No.: US 8,058,177 B2
(45) Date of Patent: Nov. 15, 2011

(54) WINGED VIAS TO INCREASE OVERLAY MARGIN

(75) Inventors: Martin Weiss, Portland, OR (US); Ruth Brain, Portland, OR (US); Bob Bigwood, Hillsboro, OR (US); Shannon Daviess, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/183,518

(22) Filed: Jul. 31, 2008

(65) Prior Publication Data

US 2010/0025858 A1 Feb. 4, 2010

(51) Int. Cl.
*H01L 21/311* (2006.01)

(52) U.S. Cl. ........ 438/701; 438/702; 438/703; 438/761; 438/763; 438/787; 257/396; 257/397; 257/432; 257/434; 257/435

(58) Field of Classification Search ............... 438/700, 438/701, 702, 703, 761, 763, 787, 791, FOR. 107, 438/FOR. 118, FOR. 388, FOR. 395; 257/396, 257/397, 431, 432, 434, 435, E21.579, E21.545, 257/E21.546, E21.553
See application file for complete search history.

(56) References Cited

U.S. PATENT DOCUMENTS

| 6,048,445 | A | 4/2000 | Brain | |
|---|---|---|---|---|
| 6,365,514 | B1 | 4/2002 | Yu et al. | |
| 6,774,037 | B2 | 8/2004 | Hussein et al. | |
| 6,927,495 | B2 * | 8/2005 | Arita et al. | 257/758 |
| 6,958,547 | B2 | 10/2005 | Dubin et al. | |
| 7,008,872 | B2 | 3/2006 | Dubin et al. | |
| 7,037,841 | B2 * | 5/2006 | Wu et al. | 438/700 |
| 7,112,537 | B2 * | 9/2006 | Keum | 438/738 |
| 7,314,829 | B2 | 1/2008 | Weiss et al. | |
| 7,341,937 | B2 * | 3/2008 | Arita et al. | 438/626 |
| 7,349,105 | B2 | 3/2008 | Weiss | |
| 7,435,686 | B2 * | 10/2008 | Verhaverbeke | 438/706 |
| 7,473,639 | B2 * | 1/2009 | Jung | 438/629 |
| 7,547,669 | B2 * | 6/2009 | Lee | 510/175 |
| 2008/0076244 | A1 * | 3/2008 | Ye et al. | 438/597 |

OTHER PUBLICATIONS

Weiss, Martin et al., "Wafer-Level Alignment Structures Using Subwavelength Grating Polarizers", U.S. Appl. No. 11/823,107, filed Jun. 26, 2007.

* cited by examiner

*Primary Examiner* — N Drew Richards
*Assistant Examiner* — Joannie A Garcia
(74) *Attorney, Agent, or Firm* — Cool Patent, P.C.; Joseph P. Curtin

(57) ABSTRACT

Winged via structures to increase overlay margin are generally described. In one example, a method comprises depositing a sacrificial layer to an interlayer dielectric, the interlayer dielectric being coupled with a semiconductor substrate, forming at least one trench structure in the sacrificial layer wherein the trench structure comprises a first direction along a length of the trench structure and a second direction along a width of the trench structure wherein the second direction is substantially perpendicular to the first direction, depositing a light sensitive material to the trench structure and the sacrificial layer, and patterning at least one winged via structure in the light sensitive material to overlay the trench structure wherein the winged via structure extends in the second direction beyond the width of the trench structure onto the sacrificial layer.

7 Claims, 6 Drawing Sheets a b a b

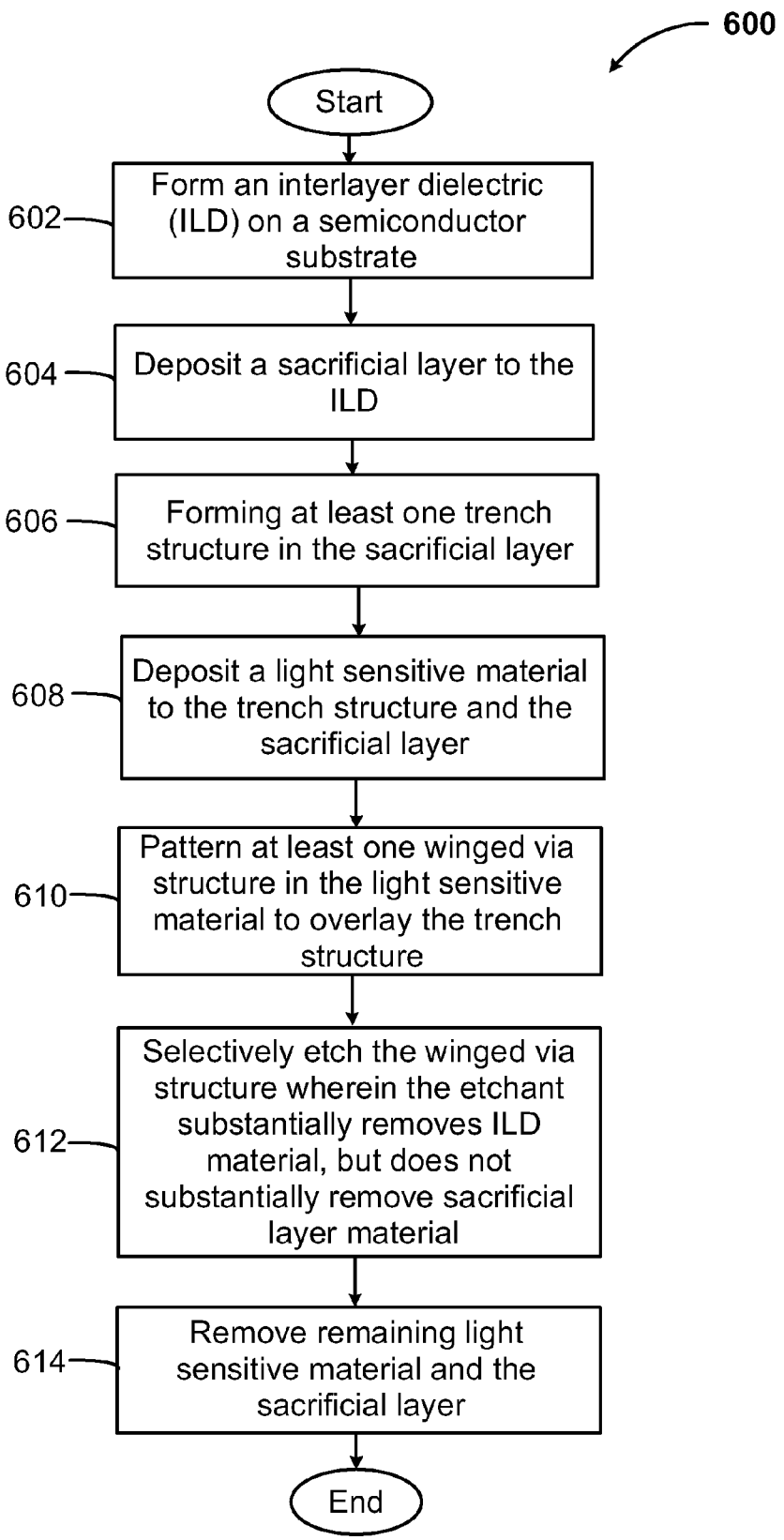

WINGED VIAS TO INCREASE OVERLAY MARGIN

BACKGROUND

Generally, overlay error of a via structure to a previous layer structure may adversely affect a critical dimension of the via structure. For example, overlay error may reduce a critical dimension of a via structure such that the via doesn't etch to full depth, or can't be filled with metal, or the via is functional but suffers from higher resistance compared with an aligned via.

BRIEF DESCRIPTION OF THE DRAWINGS

Embodiments disclosed herein are illustrated by way of example, and not by way of limitation, in the figures of the accompanying drawings in which like reference numerals refer to similar elements and in which:

FIG. 6 is a flow diagram of a method for increasing overlay margin using a winged via structure, according to but one embodiment.

Figure 1:
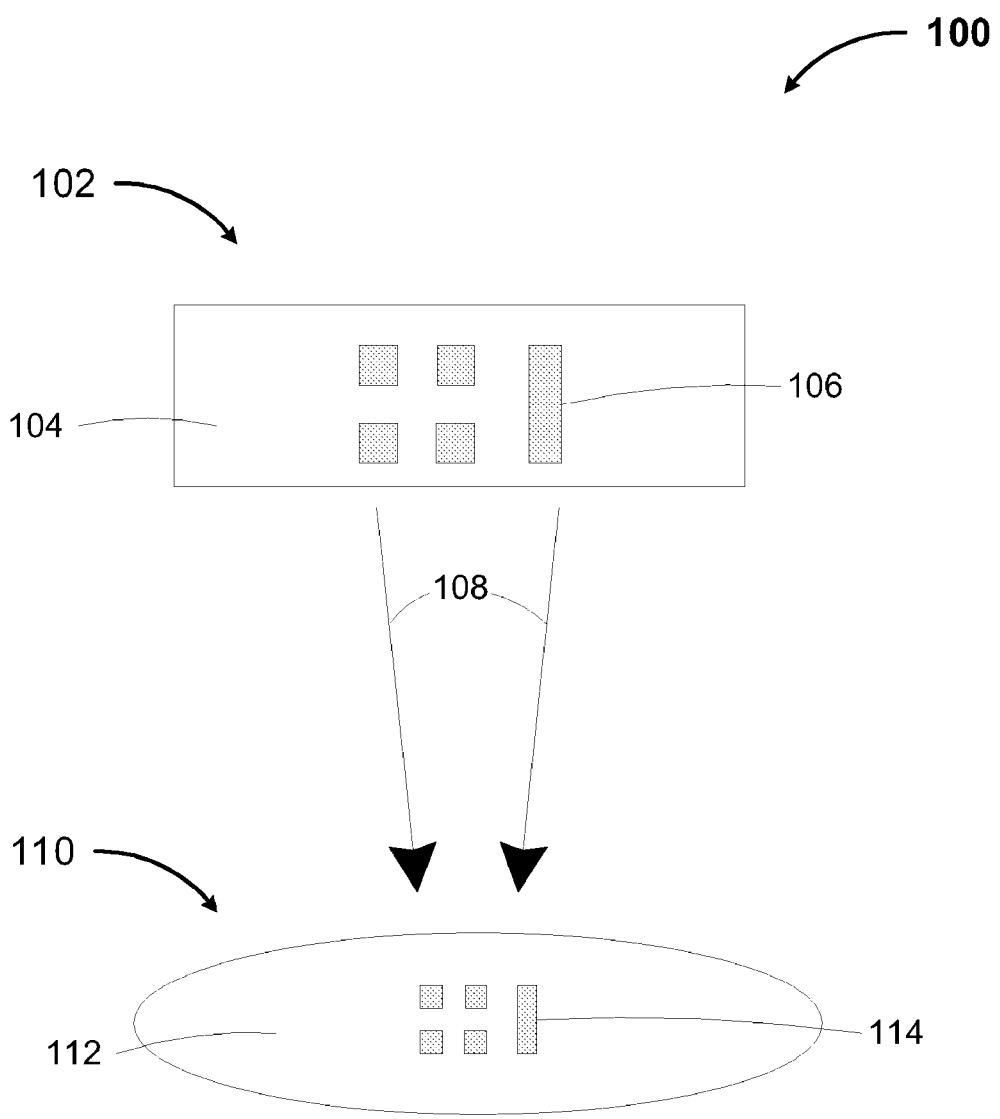
FIG. 1 is a schematic of a system comprising a photomask and a semiconductor substrate, according to but one embodiment.

For simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of winged vias to increase overlay margin are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout the specification to "one embodiment" or "an embodiment" means that a particular feature, structure or characteristic described in connection with the embodiment is included in at least one embodiment. Thus, appearances of the phrases "in one embodiment" or "in an embodiment" in various places throughout the specification are not necessarily referring to the same embodiment. Furthermore, the particular features, structures or characteristics may be combined in any suitable manner in one or more embodiments.

FIG. 1 is a schematic of a system comprising a photomask and a semiconductor substrate, according to but one embodiment. In an embodiment, system 100 includes a photomask 102 comprising a photomask substrate 104 and an integrated circuit (IC) pattern 106 formed in or on the photomask substrate 104. System 100 may further include a semiconductor substrate 110 comprising a surface 112 of the semiconductor substrate upon which one or more IC structures 114 are formed. In an embodiment, system 100 comprises a stepper, scanner, or other lithography equipment that uses light energy 108 to transfer an IC pattern 106 from a photomask 102 to form an IC structure 114 on a surface 112 of a semiconductor substrate 110.

An IC structure 114 may be formed in a light sensitive material such as, for example, photoresist coupled with a surface 112 of the semiconductor substrate in response to light energy 108 that transfers the IC pattern 106 of the photomask 102 to the light sensitive material on the surface 112 of the semiconductor substrate 110. In an embodiment, system 100 includes a photomask substrate 104 and at least one winged via pattern 106 as described herein coupled with the photomask substrate, the winged via pattern 106 to form a winged via structure 114 in a light sensitive material coupled with a semiconductor substrate 110 in response to light energy 108 that transfers the winged via pattern 106 to the light sensitive material.

Photomask 102 may include a variety of types of photomasks. In an embodiment, photomask 102 comprises refractive or reflective photomasks including, for example, optical, extreme ultraviolet (EUV), and/or x-ray technologies. In an embodiment, optical photomasks 102 include, for example, 157 nanometer (nm), 193 nm, 248 nm, and/or 365 nm masks, but may also include masks suited for other wavelengths of light. An optical photomask 102 may generally include materials such as quartz or various types of silica including fused silica and chrome, chrome oxide, and/or chrome oxynitride or molybdenum silicide, but may include other materials in other embodiments. An EUV mask 102 may include a ruthenium (Ru) capped molybdenum silicon (MoSi) multilayer blank among other materials and/or structures. EUV masks 102 may also comprise a low thermal expansion material (LTEM). Photomask 102 may be used in immersion technologies in another embodiment.

Light energy 108 may include a variety of light energies. In an embodiment, light energy includes visible or invisible light energy. Light energy 108 includes light having a wavelength of 365 nm, 248 nm, 193 nm, or 157 nm, in an embodiment, but may include other wavelengths in other embodiments. In another embodiment, light energy 108 includes ultraviolet light including EUV light or x-ray.

Semiconductor substrate 110 may be a wafer having a surface 112 upon which one or more IC devices are formed. In one embodiment, semiconductor substrate 110 includes wafers having a diameter of about 6 inches, 8 inches, 12 inches, or 16 inches. Other sizes are within the scope of this description. Semiconductor materials for semiconductor substrate 110 may include silicon, germanium, group III-V semiconductor materials, group II-VI semiconductor materials, or any other suitable semiconductor material. In an embodiment, one or more transistor structures are formed on semiconductor substrate 110 using a variety of semiconductor fabrication processes followed by forming one or more interconnect structures to couple the one or more transistor structures with other electronic devices or systems. In an embodiment, winged via pattern 106 is used to form a winged via structure 114 wherein the winged via structure 114 increases overlay margin for the one or more interconnect structures. In other embodiments, winged via pattern 106 is used to increase overlay margin for any hole-type structure 114 formed on semiconductor substrate 110.

Figure 2:
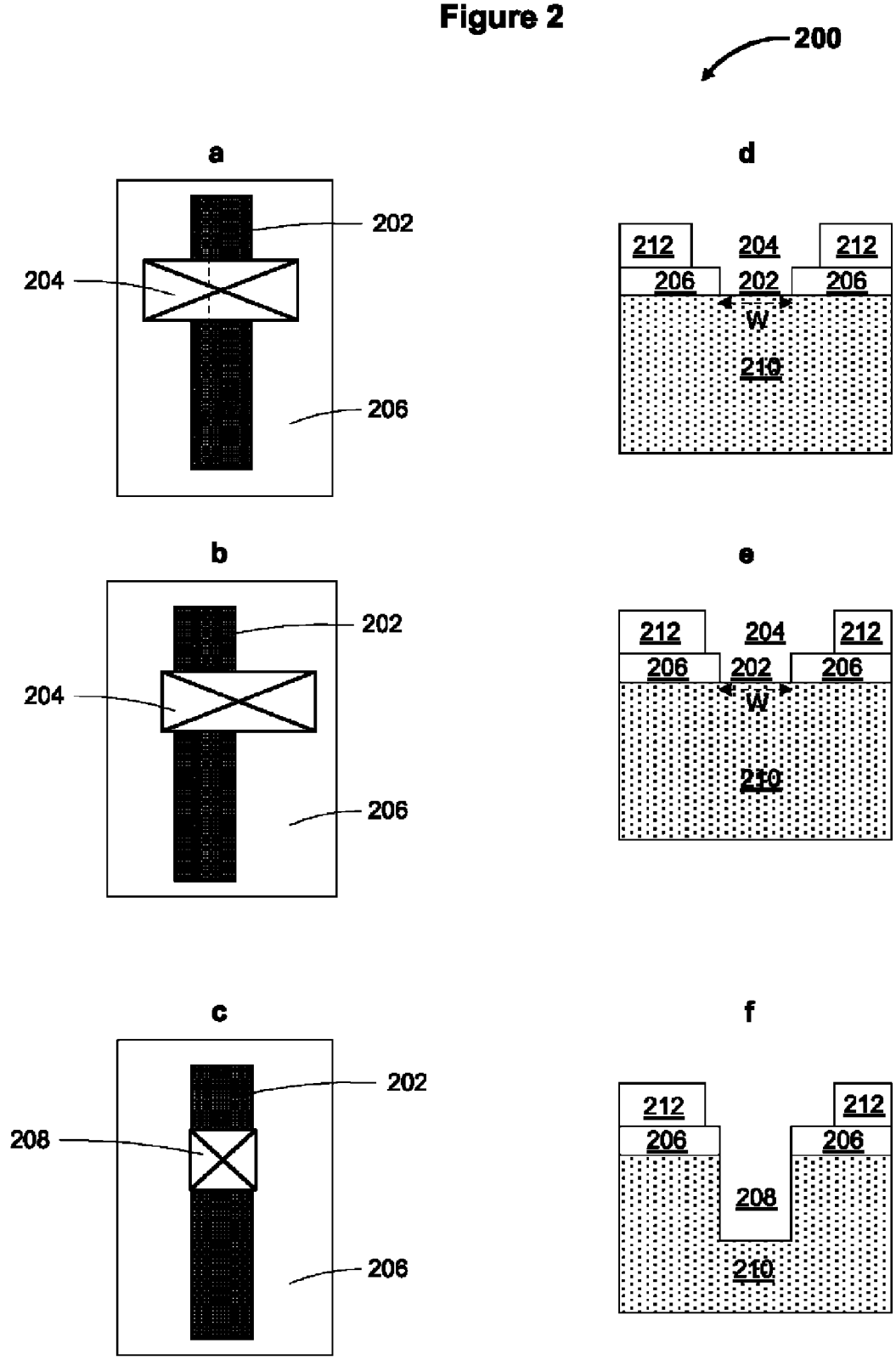
FIG. 2 depicts both a plan view and elevation view schematic of a winged via structure on a semiconductor substrate, according to but one embodiment.

FIG. 2 depicts both a plan view and elevation view schematic of a winged via structure on a semiconductor substrate, according to but one embodiment. In an embodiment, an integrated circuit (IC) structure 200 comprises a trench structure 202, a winged via structure 204, and a sacrificial layer 206, coupled as shown. Sacrificial layer 206 may be coupled with an underlying semiconductor substrate (not shown) wherein a variety of intervening layers, structures, and/or materials may be disposed between the sacrificial layer 206 and the semiconductor substrate. FIGS. 2*a-c* may depict a plan view schematic wherein FIG. 2*a* depicts an aligned winged via structure 204 before etch, FIG. 2*b* depicts a misaligned winged via structure 204 before etch, and FIG. 2*c* depicts a winged via structure 204 according to either FIG. 2*a* or FIG. 2*b* after etch. FIGS. 2*d-f* may depict an elevation view schematic wherein FIG. 2*d* depicts an aligned winged via structure 204 before etch, FIG. 2*e* depicts a misaligned winged via structure 204 before etch, and FIG. 2*f* depicts a winged via structure 204 according to either FIG. 2*d* or FIG. 2*e* after etch.

In an embodiment according to FIG. 2*a*, an IC structure 200 comprises a trench structure 202, an aligned winged via structure 204 before etch, and a sacrificial layer 206, coupled as shown. Sacrificial layer 206 may be coupled with an underlying semiconductor substrate through various intervening layers and/or structures including, for example, IC device structures and/or interlayer dielectric. In an embodiment, sacrificial layer 206 is a hardmask layer that is removed in subsequent operations. In another embodiment, sacrificial layer 206 comprises a material that is resilient to an etch of the winged via structure 204. Sacrificial layer may comprise materials such as silicon nitride, silicon oxynitride, titanium, titanium nitride, silicon carbide, silicon oxide, polymeric carbon, graphitic carbon, or combinations thereof. Other materials may be used in other embodiments.

One or more trench structures 202 may be formed in the sacrificial layer 206 by any suitable process including patterning by lithography and/or etch processes. Trench structure 202 may be an area where sacrificial layer 206 has been removed to allow formation of a metal line by later deposition of a metal or other electrically conductive material into the trench structure 202. In an embodiment, underlying interlayer dielectric material or a thin hardmask layer is exposed by removal of sacrificial layer 206 to form the trench structure 202. Trench structure 202 may comprise a length, L, and a width, W, as depicted by arrows. Length L may be greater than width W.

Winged via structure 204 of FIG. 2*a* may be formed in a light sensitive material deposited to the sacrificial layer 206 and the trench structure 202. Light sensitive material may not be depicted in FIGS. 2*a-c* to more clearly show underlying structures 202, 206 from a plan view. Light sensitive material 212 is depicted with respect to FIGS. 2*d-f*, which provide an elevation view of FIGS. 2*a-c*. In an embodiment, winged via structure 204 is formed in light sensitive material by depositing a light sensitive material to elements 202, 206, exposing the light sensitive material to light energy that transfers a winged via pattern of a photomask to the light sensitive material, and developing or removing either the exposed or unexposed regions of the light sensitive material to form the winged via structure 204. After patterning the light sensitive material to form the winged via structure 204, light sensitive material may continue to cover areas of trench structure 202 outside of the winged via structure 204 area to prevent removal of the trench structure in these areas during a via etch process. A light sensitive material may be a positive or negative photoresist. In an embodiment, winged via structure 204 comprises an area where light sensitive material has been removed to allow etch of exposed material in trench structure 202. Etch of underlying material may form an etched via structure 208 in trench structure 202, described further with respect to FIG. 2*c*.

Winged via structure 204 may be aligned in FIG. 2*a* because the winged via structure 204 is substantially centered over trench structure 202. In other words, the center of the winged via structure 204 may be substantially aligned with the center of the trench structure 202 in the direction of width, W. In an embodiment, IC structure 200 comprises a semiconductor substrate, a sacrificial layer 206 coupled with the semiconductor substrate, at least one trench structure 202 formed in the sacrificial layer 206 wherein the trench structure comprises a first direction along the length, L, of the trench structure 202 and a second direction along the width, W, of the trench structure. IC structure 200 may further comprise a light sensitive material 212 coupled to the sacrificial layer 206. Light sensitive material 212 may be photoresist deposited to the surfaces of the sacrificial layer 206 and the trench structure 202 by any suitable deposition technique. IC structure 200 may further comprise at least one winged via structure 204 formed in the light sensitive material 212 wherein the winged via structure 204 extends in the second direction beyond the width, W, of the trench structure 202 onto the sacrificial layer 206.

In an embodiment according to FIG. 2*b*, an IC structure 200 comprises a trench structure 202, a misaligned winged via structure 204 before etch, and a sacrificial layer 206, coupled as shown. Winged via structure 204 may be misaligned in FIG. 2*b* because the winged via structure 204 is not substantially centered over trench structure 202. In other words, the center of the winged via structure 204 may not be substantially aligned with the center of the trench structure 202 in the direction of width, W. The wings of the winged via structure 204 may be the areas of winged via structure 204 that extend beyond the edges of the trench structure 202 in the direction of W, the width.

In an embodiment, the winged via structure 204 increases overlay margin for the winged via structure 204 to align to the trench structure 202. Winged via structure 204 may increase overlay margin by an amount equal to a combined distance that wings of winged via structure 204 extend beyond the edges of the trench structure 202 in the direction of W, the width. Wings may be the area of winged via structure 204 that extends beyond the width, W, of either side of the trench structure. In an embodiment, winged via structure 204 allows a via-to-metal layer misalignment as large as the extension of the wings without adversely impacting a critical dimension (CD) of an etched via structure 208.

Increasing overlay margin may provide a variety of benefits. An increased process window for registration or overlay may reduce problems associated with loss of CD for etched via structure 208 such as partially-etched vias, incomplete metal fill of vias, via opens, or vias having higher resistance. Increased overlay margin may increase device yields, reliability, and/or speed as a benefit. More benefits may be described with respect to a photomask of FIGS. 4-5.

In an embodiment according to FIG. 2*c*, an IC structure 200 comprises a trench structure 202, a winged via structure 208 after etch, and a sacrificial layer 206, coupled as shown. In an embodiment, IC structure 200 of FIG. 2*c* comprises an etched via structure 208 wherein the winged via structure 204 is aligned before etch as in FIG. 2a or wherein the winged via structure 204 was misaligned before etch as in FIG. 2b.

In an embodiment, winged via structures 204 are used in conjunction with a self-aligned via (SAV) process flow wherein an etch used to form etched via structure 208 is selectively blocked by sacrificial layer 206. Thus, the etch used to form etched via structure 208 only removes material from the trench structure 202 that is patterned with winged via structure 204. The wings of winged via structures 204 of FIGS. 2a-b may not be etched into the sacrificial layer due to the resilience of a material used for sacrificial layer 206 to the via etch process. As long as a winged via structure 204 misalignment is less than or equal to a distance that the wings extend, an etched via structure 208 will be correctly positioned on a metal line trench structure 202. In an embodiment, etched via structure 208 is a hole-type structure within trench structure 202 to couple the trench structure 202 with underlying IC structures.

Winged via structure 204 or etched via structure 208 may comprise hole-type structures and may be rectangular, circular, or any other shape. In an embodiment, the trench structure 202 is used to form an interconnect metal line of an IC device such as logic or memory and the winged via structure 204 is used to form an interconnect via structure 208 of the IC device. IC structure 200 may be a part of an IC device for memory or logic applications in one embodiment, but may be used in other suitable technologies as well.

FIGS. 2d-f may provide an elevation cross-section schematic of FIGS. 2a-c to further clarify the nature and relationship of structures of IC structure 200. In an embodiment according to FIG. 2d, an IC structure 200 comprises a trench structure 202, an aligned winged via structure 204 before etch, a sacrificial layer 206, interlayer dielectric (ILD) 210, and light sensitive material 212, coupled as shown. FIG. 2d may be a cross-section of FIG. 2a through the aligned winged via structure 204 in the direction of W, the width. FIG. 2d may comport with embodiments described with respect to FIG. 2a.

In an embodiment according to FIG. 2e, an IC structure 200 comprises a trench structure 202, a misaligned winged via structure 204 before etch, a sacrificial layer 206, ILD 210, and light sensitive material 212, coupled as shown. FIG. 2e may be a cross-section of FIG. 2b through the aligned winged via structure 204 in the direction of W, the width. FIG. 2e may comport with embodiments described with respect to FIG. 2b.

In an embodiment according to FIG. 2f, an IC structure 200 comprises a sacrificial layer 206, an etched via structure 208, ILD 210, and light sensitive material 212, coupled as shown. In an embodiment, IC structure 200 of FIG. 2f comprises an etched via structure 208 wherein a winged via structure 204 is aligned before etch as in FIG. 2d or wherein the winged via structure 204 was misaligned before etch as in FIG. 2e. Sacrificial layer 206 may comprise a material that is not removed by an etch process that forms etched via structure 208 and ILD 210 may comprise a material that is removed by an etch process that forms etched via structure 208.

Figure 3:
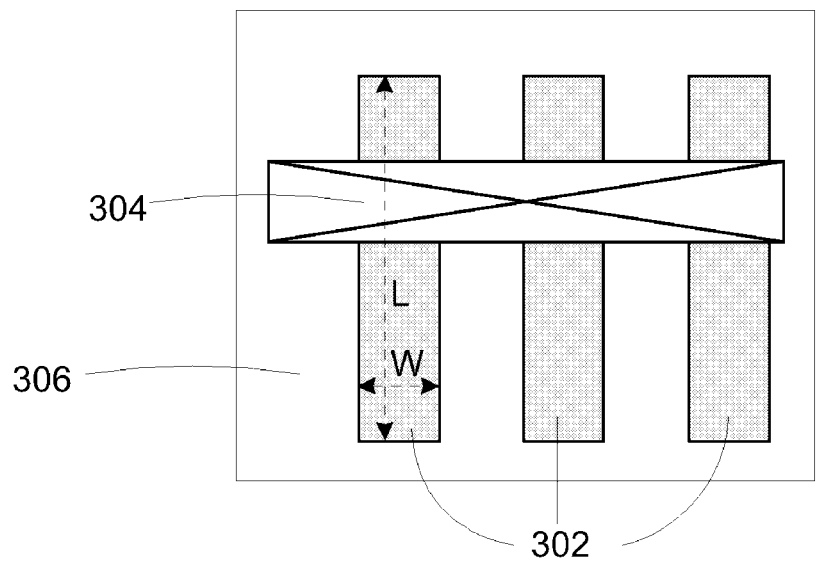
FIG. 3 is a plan view schematic of another winged via structure on a semiconductor substrate, according to but one embodiment.
Figure 3:
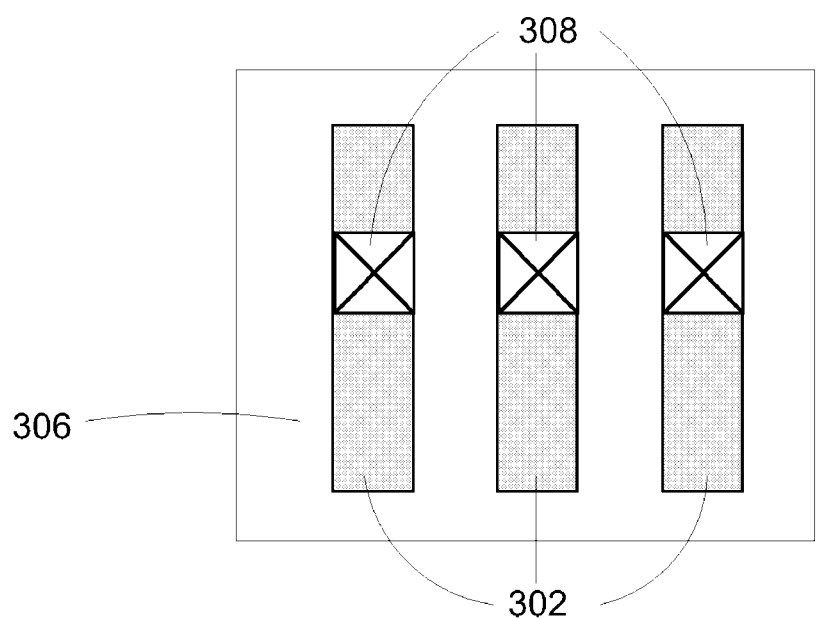

FIG. 3 is a plan view schematic of another winged via structure on a semiconductor substrate, according to but one embodiment. In an embodiment, an integrated circuit (IC) structure 300 comprises one or more trench structures 302, a winged via structure 304, and a sacrificial layer 306, coupled as shown. Sacrificial layer 306 may be coupled with an underlying semiconductor substrate (not shown) wherein a variety of intervening layers, structures, and/or materials may be disposed between the sacrificial layer 306 and the semiconductor substrate. FIG. 3a may depict a merged winged via structure 304 before etch, and FIG. 3b may depict etched via structures 308 formed by etching the merged winged via structure 304 of FIG. 3a.

In an embodiment according to FIG. 3a, an IC structure 300 comprises one or more trench structures 302, a merged winged via structure 304 before etch, and a sacrificial layer 306, coupled as shown. In IC layouts wherein one or more trench structures 302 are parallel and/or adjacent, one or more winged via structures may be combined or merged into a single merged via structure 304.

In an embodiment, an overlay margin for the left-most edge of the left-most trench structure 302 as well as a right-most-edge of the right-most trench structure 302 is determined by wing size of the merged via structure 304. Overlay margin for trench structures 302 in between trench structures 302 at the edges of an arrangement depicted in FIG. 3a may be substantially larger because a misalignment of merged via structure 304 that fails to extend beyond a trench structure 302 at the edge may still extend beyond a trench structure 302 in between the edge trench structures 302. Thus, trench structures 302 at the ends of an arrangement depicted with respect to FIG. 3a have the most significant chance of failing overlay. As long as the wings of merged via structure 304 reach or extend beyond the trench structures 302 onto the sacrificial layer 306, the etched via structures 308 will be aligned within the one or more trench structures 302.

Merged via structure 304 may provide other benefits. Merged via structure 304 may allow use of tighter pitch between etched via structures 308 than otherwise achievable. For example, mask error enhancement factor (MEEF) may be reduced to about zero by using a merged via structure 304 that allows the pitch between etched via structures 308 to be primarily determined by preceding or underlying metal line trenches, lines, or other structures. A lower MEEF may prevent small variations in a photomask from having a large effect on printed feature size.

In an embodiment, an IC structure 300 comprises a semiconductor substrate, a sacrificial layer 306 coupled with the semiconductor substrate, and at least one trench structure 302 formed in the sacrificial layer wherein the trench structure 302 comprises a first direction along the length, L, of the trench structure 302 and a second direction along the width, W, of the trench structure 302 wherein the second direction is substantially perpendicular to the first direction. IC structure 300 may further comprise a light sensitive material (not shown) coupled to the sacrificial layer 306 and at least one winged via structure 304 formed in the light sensitive material wherein the winged via structure extends in the second direction beyond the width, W, of the trench structure 302 onto the sacrificial layer 306. IC structure 300 may further comprise other trench structures 302 that are substantially parallel with the trench structure 302 wherein the winged via structure 304 is a merged via structure that extends in the second direction across the other trench structures 302 onto the sacrificial layer 306.

In an embodiment according to FIG. 3b, an IC structure 300 comprises one or more trench structures 302, one or more etched via structures 308, and a sacrificial layer 306, coupled as shown. Etching a merged via structure 304 of FIG. 3a may provide a row of adjacent etched via structures 308. A via etch process may be selective such that it does not etch regions of sacrificial layer 306 that are patterned by merged via structure 304, but does etch regions of one or more trench structures 302 that are patterned by merged via structure 304.

Figure 4:
FIG. 4 is a plan view schematic of a photomask comprising a winged via pattern, according to but one embodiment.
Figure 4:
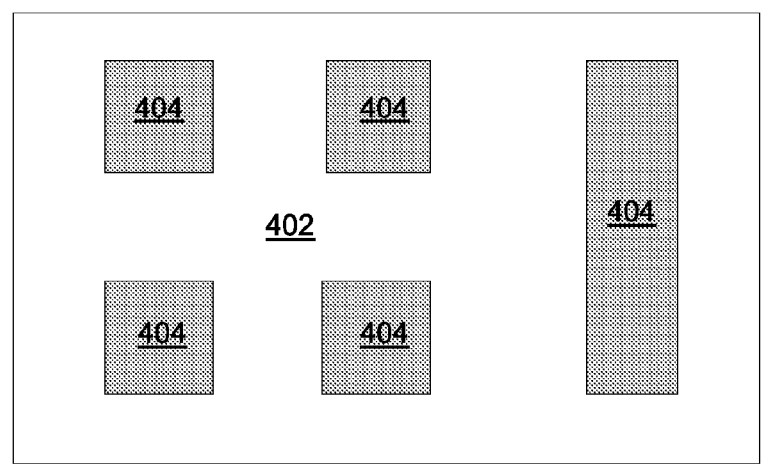
Figure 4:
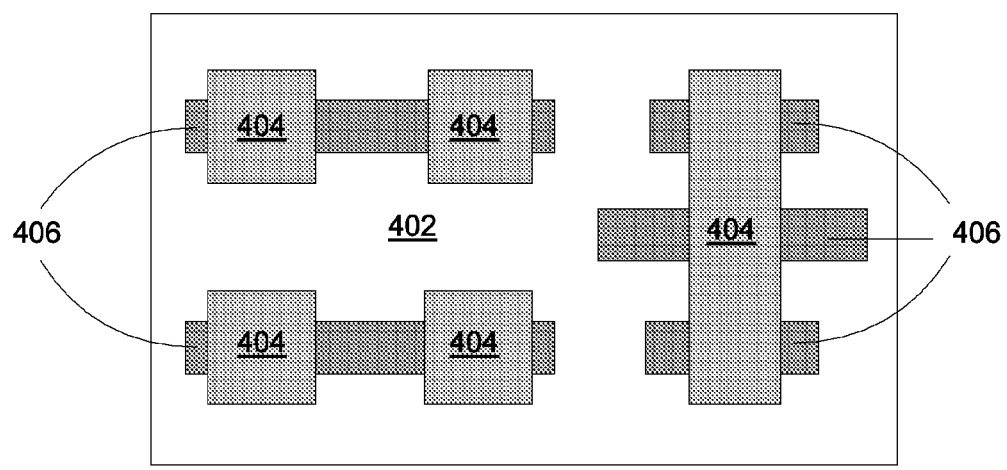

FIG. 4 is a plan view schematic of a photomask comprising a winged via pattern, according to but one embodiment. In an embodiment, a photomask 400 comprises a photomask substrate 402 and one or more winged via patterns 404, coupled as shown. FIG. 4a may depict only a photomask for patterning winged via structures and FIG. 4b may depict a photomask for patterning winged via structures overlayed with corresponding line or trench patterns 406 of a preceding photomask to show the relative size of the winged via patterns 404 to line or trench patterns 406 of the preceding photomask. The relative size depicted may be conceptual and not exact. In other words, wings of the winged via patterns 404 may extend beyond a width of preceding line or trench patterns 406 similar to embodiments described with respect to FIGS. 1-3.

In an embodiment according to FIG. 4a, a photomask 400 comprises a photomask substrate 402 and at least one winged via pattern 404 coupled with the photomask substrate 402, the winged via pattern 404 to form a winged via structure in a light sensitive material coupled with a semiconductor substrate in response to light energy that transfers the winged via pattern 404 to the light sensitive material. Photomask substrate 402 may be for a photomask 400 comprising optical, EUV, x-ray, binary, phase-shifting, attenuated phase-shifting, or immersion lithography technologies, or combinations thereof. Photomask 400 may accord with embodiments already described with respect to FIGS. 1-3. Winged via pattern 404 may be used to form a single winged via structure 404 or merged winged via structures 404 as described with respect to FIGS. 2-3.

In an embodiment according to FIG. 4b, a photomask 400 comprising winged via patterns 404 is overlayed with corresponding line or trench patterns 406 of a preceding photomask to show the relative size of the winged via patterns 404 to line or trench patterns 406 of the preceding photomask. A preceding photomask may include a photomask for a pattern or layer that is used prior to a photomask 400 comprising winged via patterns 404. In an embodiment, preceding photomask includes line or trench patterns 406 to form one or more metal interconnects of an IC device. In an embodiment, the winged via pattern 404 extends beyond a width of a corresponding line or trench pattern 406 of a preceding photomask to increase an overlay margin for a winged via structure formed on a semiconductor substrate. A corresponding line or trench pattern 406 may be a line or trench pattern 406 that is to be overlayed by a particular winged via pattern 404 by design.

Photomask 400 may comprise a photomask substrate 402 and at least one winged via pattern 404 coupled with the photomask substrate 402, the winged via pattern 404 to form a winged via structure in a light sensitive material coupled with a semiconductor substrate in response to light energy that transfers the winged via pattern 404 to the light sensitive material. A sacrificial layer may be coupled with the semiconductor substrate and at least one trench structure may be formed in the sacrificial layer wherein the trench structure comprises a first direction along the length of the trench structure and a second direction along the width of the trench structure, the second direction being substantially perpendicular to the first direction wherein the light sensitive material is coupled to the sacrificial layer by, for example, deposition. The winged via structure formed in the light sensitive material may extend in the second direction beyond the width of the trench structure onto the sacrificial layer. A photomask may be referred to as a reticle.

Winged via patterns 404 may provide other benefits. In addition to increasing overlay margin for via-to-metal layer alignment, winged via patterns 404 may be physically larger than non-winged via patterns providing a larger process window for lithography settings such as depth of focus or exposure latitude for printing winged via patterns 404.

Figure 5:
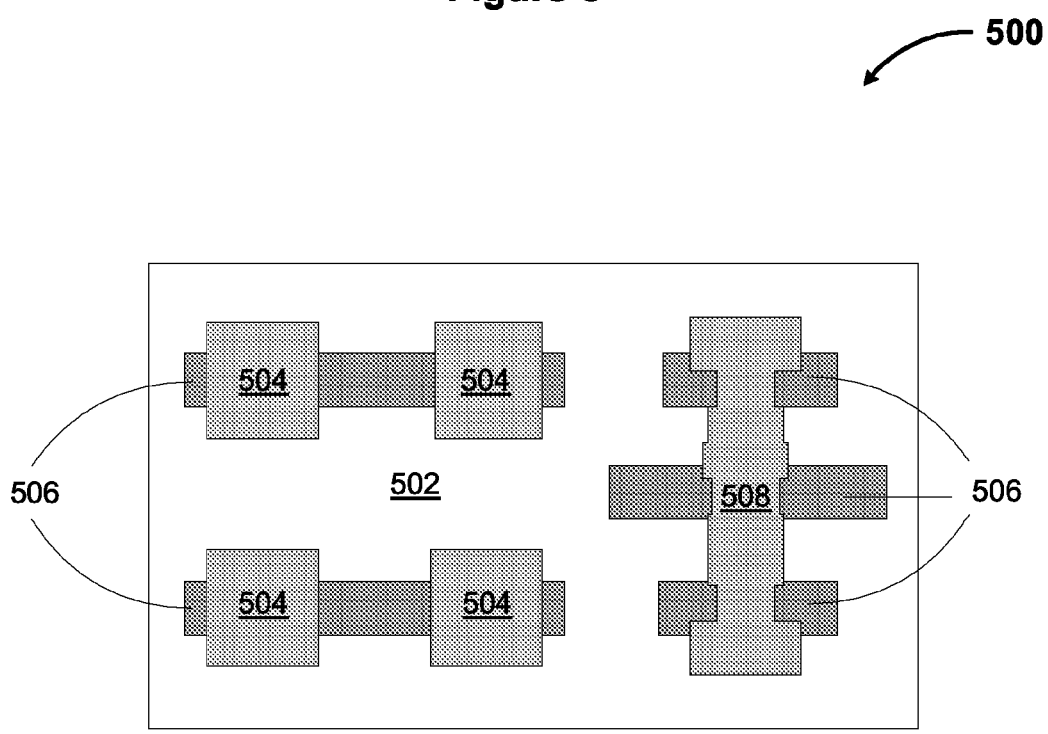
FIG. 5 is a plan view schematic of another photomask comprising a winged via pattern, according to but one embodiment.

FIG. 5 is a plan view schematic of another photomask comprising a winged via pattern, according to but one embodiment. In an embodiment, a photomask 500 comprises a photomask substrate 502 and one or more winged via patterns 504, 508 coupled as shown. FIG. 5 may further depict a photomask 500 for patterning winged via structures overlayed with corresponding line or trench patterns 506 of a preceding photomask to show the relative size of the winged via patterns 504, 508 to line or trench patterns 506 of the preceding photomask. The relative size depicted may be conceptual and not exact. In other words, wings of the winged via patterns 504, 508 may extend beyond a width of preceding line or trench patterns 506 similar to embodiments described with respect to FIGS. 1-4.

Winged via pattern 508 may comprise a variety of features or structures to assist in printing or resolving the winged via pattern 508 in a desired manner on a semiconductor substrate. Printing on a semiconductor substrate may include printing on one or more layers or materials coupled with a semiconductor substrate. In an embodiment, winged via pattern 508 includes optical proximity correction (OPC) features including serifs, hammerheads, or any other OPC structure. In another embodiment, other resolution enhancement techniques (RET) such as sub-resolution assist features (SRAF) are incorporated in winged via pattern 508. In an embodiment, winged via pattern 504 is substantially rectangular. In other embodiments, winged via pattern 508 comprises OPC features or RET features, or combinations thereof. Rectangular winged via patterns 504 may be combined with winged via patterns 508 comprising OPC or RET features, or combinations thereof. Other well-known resolution enhancing techniques or lithography patterning techniques may be used in other embodiments.

FIG. 6 is a flow diagram of a method for increasing overlay margin using a winged via structure, according to but one embodiment. In an embodiment, method 600 includes forming an interlayer dielectric (ILD) on a semiconductor substrate at box 602, depositing a sacrificial layer to the ILD at box 604, forming at least one trench structure in the sacrificial layer at box 606, depositing a light sensitive material to the trench structure and the sacrificial layer at box 608, patterning at least one winged via structure in the light sensitive material to overlay the trench structure at box 610, selectively etching the winged via structure wherein the etchant substantially removes ILD material, but does not substantially remove sacrificial layer material at box 612, and removing remaining light sensitive material and the sacrificial layer at box 614.

Forming an ILD on a semiconductor substrate 602 may comprise depositing an ILD material to one or more structures and/or layers formed on a semiconductor substrate. Several intervening structures may be formed or deposited between ILD and the semiconductor substrate. In an embodiment, forming an ILD on a semiconductor substrate 602 comprises depositing any suitable dielectric material that is removed by a via etch process. ILD may comprise, for example, silicon oxide ($SiO_2$), carbon-doped oxides (CDO) such as $C_xSi_yO_z$, fluorine-doped oxides ($SiOF_x$), and/or polymer materials, where x, y, and z represent suitable stoichiometric quantities of the respective elements.

In an embodiment, method 600 comprises depositing a sacrificial layer to an ILD 604, the ILD being coupled with a semiconductor substrate. ILD may be coupled with the semiconductor substrate through various intervening structures and/or layers. Depositing the sacrificial layer to the ILD 604 may comprise depositing a sacrificial layer material that is resilient to a subsequent etch 612 of a winged via structure. In an embodiment, depositing the sacrificial layer 604 comprises depositing a sacrificial layer comprising silicon nitride, silicon oxynitride, titanium, titanium nitride, silicon carbide, silicon oxide, polymeric carbon, graphitic carbon, or combinations thereof. In other embodiments, other suitable materials for sacrificial layer 604 may be used.

Method 600 may further comprise forming at least one trench structure in the sacrificial layer 606 wherein the trench structure comprises a first direction along a length of the trench structure and a second direction along a width of the trench structure wherein the second direction is substantially perpendicular to the first direction. Forming at least one trench structure in the sacrificial layer 606 may comprise patterning at least one trench structure on the sacrificial layer using lithography processes and etching the patterned trench structure into the sacrificial layer. Lithography processes may include, for example, spin, expose, and/or develop operations where a light sensitive material is deposited or spun onto the sacrificial layer, exposed with light that transfers a pattern from a photomask to the light sensitive material, and developed to remove either the exposed or unexposed regions to form the trench structure in the light sensitive material. Subsequent etching may transfer the trench structure in the light sensitive material to the sacrificial layer.

Method 600 may further comprise depositing a light sensitive material to the trench structure and the sacrificial layer 608. Depositing a light sensitive material 608 may be accomplished by any suitable deposition method such as, for example, spinning on a photoresist material. A light sensitive material may refer to materials used in lithography processes such as photoresist. In an embodiment, depositing the light sensitive material 608 to the trench structure and the sacrificial layer comprises depositing a negative or positive photoresist to the trench structure and the sacrificial layer.

In an embodiment, method 600 further comprises patterning at least one winged via structure in the light sensitive material 610 to overlay the trench structure wherein the winged via structure extends in the second direction beyond the width of the trench structure onto the sacrificial layer. Patterning the winged via structure in the light sensitive material 610 may be accomplished by lithography processes described above including deposition of photoresist, exposure using a winged via pattern, and developing the exposed or unexposed light sensitive material. In an embodiment, patterning the winged via structure in the light sensitive material 610 comprises using a photomask comprising at least one winged via pattern to form the winged via structure in the light sensitive material in response to light energy that transfers the winged via pattern to the light sensitive material. A photomask may accord with embodiments described with respect to FIGS. 4-5. In another embodiment, patterning at least one winged via structure increases overlay margin for the winged via structure to align to the trench structure compared with a non-winged via structure. A non-winged via structure may be a via structure wherein the via structure does not extend in the second direction beyond the width of the trench structure onto the sacrificial layer.

Method 600 may further comprise selectively etching the winged via structure 612 to substantially remove ILD material without substantially removing sacrificial layer material to form one or more etched via structures in the interlayer dielectric. Selectively etching the winged via structure 612 may be accomplished by using an etch process that removes ILD material, but not sacrificial layer material. In an embodiment, an etchant for selectively etching the winged via structure 612 comprises any suitable etchant that substantially removes underlying ILD without substantially removing sacrificial layer material. An etchant for etching winged via structure 612 may comprise, for example, carbon monoxide (CO), nitrogen ($N_2$), trifluoromethane ($CHF_3$), octafluorocyclobutane ($C_4F_8$), and/or $CH_xF_y$, where x and y represent suitable stoichiometric quantities of the respective elements.

In an embodiment, method 600 further comprises removing remaining light sensitive material and the sacrificial layer 614. Light sensitive material and sacrificial layer 614 may be removed by etch cleans or removal processes. Method 600 described herein may further include other semiconductor fabrication processes such as lithography, etch, thin films deposition, planarization, diffusion, metrology, or any other associated action with semiconductor fabrication. A product fabricated by method 600 is also disclosed and within the spirit and scope of this description.

Various operations may be described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of the description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. A method, comprising:
   depositing a sacrificial layer to an interlayer dielectric, the interlayer dielectric being coupled with a semiconductor substrate;
   forming at least one trench structure in the sacrificial layer, the trench structure comprising a first direction along a length of the trench structure and a second direction along a width of the trench structure, the second direction being substantially perpendicular to the first direction;
   depositing a light-sensitive material to the trench structure and the sacrificial layer; and
   patterning at least one winged via structure in the light-sensitive material to overlay the trench structure, the winged via structure extending in the second direction beyond the width of the trench structure onto the sacrificial layer.

2. A method according to claim 1, further comprising:
   selectively etching the winged via structure to substantially remove interlayer dielectric material without substantially removing sacrificial layer material to form one or more etched via structures in the interlayer dielectric.

3. A method according to claim 1, wherein depositing the sacrificial layer to the interlayer dielectric comprises depositing a sacrificial layer comprising silicon nitride, silicon oxynitride, titanium, titanium nitride, silicon carbide, silicon oxide, polymeric carbon, graphitic carbon, or combinations thereof.

4. A method according to claim 1, wherein forming at least one trench structure in the sacrificial layer comprises:
  patterning at least one trench structure on the sacrificial layer using lithography processes; and
  etching the patterned trench structure into the sacrificial layer.

5. A method according to claim 1, wherein depositing the light-sensitive material to the trench structure and the sacrificial layer comprises depositing a negative or positive photoresist to the trench structure and the sacrificial layer.

6. A method according to claim 1, wherein patterning at least one winged via structure increases overlay margin for the winged via structure to align to the trench structure compared with a non-winged via structure.

7. A method according to claim 1, wherein patterning at least one winged via structure in the light-sensitive material comprises using a photomask comprising at least one winged via pattern to form the winged via structure in the light-sensitive material in response to light energy that transfers the winged via pattern to the light-sensitive material.

* * * * *